(12) United States Patent
Lai et al.

(10) Patent No.: US 8,951,855 B2
(45) Date of Patent: Feb. 10, 2015

(54) MANUFACTURING METHOD FOR SEMICONDUCTOR DEVICE HAVING METAL GATE

(75) Inventors: Chien-Ming Lai, Tainan (TW); Rai-Min Huang, Taipei (TW); Tong-Jyun Huang, Tainan (TW); Che-Hua Hsu, Hsinchu County (TW); Yi-Wen Chen, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 338 days.

(21) Appl. No.: 13/454,337

(22) Filed: Apr. 24, 2012

(65) Prior Publication Data
US 2013/0280900 A1    Oct. 24, 2013

(51) Int. Cl.
*H01L 21/8238*    (2006.01)

(52) U.S. Cl.
USPC ......................................... 438/199

(58) Field of Classification Search
CPC .............. H01L 21/823828; H01L 21/823842; H01L 29/66545
USPC .................. 438/199, 212, 270; 257/E21.085, 257/E21.409, E21.444
See application file for complete search history.

(56) References Cited

U.S. PATENT DOCUMENTS

| | | | |
|---|---|---|---|
| 6,033,963 A | 3/2000 | Huang et al. |
| 6,653,698 B2 | 11/2003 | Lee et al. |
| 6,858,483 B2 | 2/2005 | Doczy et al. |
| 6,921,711 B2 | 7/2005 | Cabral, Jr. et al. |
| 6,953,719 B2 | 10/2005 | Doczy et al. |
| 6,967,131 B2 | 11/2005 | Saenger et al. |
| 6,972,225 B2 | 12/2005 | Doczy et al. |
| 7,029,966 B2 | 4/2006 | Amos et al. |
| 7,056,794 B2 | 6/2006 | Ku et al. |
| 7,064,050 B2 | 6/2006 | Cabral, Jr. et al. |
| 7,064,066 B1 | 6/2006 | Metz et al. |
| 7,074,680 B2 | 7/2006 | Doczy et al. |
| 7,112,851 B2 | 9/2006 | Saenger et al. |
| 7,126,199 B2 | 10/2006 | Doczy et al. |
| 7,148,548 B2 | 12/2006 | Doczy et al. |
| 7,153,734 B2 | 12/2006 | Brask et al. |
| 7,157,378 B2 | 1/2007 | Brask et al. |
| 7,183,184 B2 | 2/2007 | Doczy et al. |
| 7,220,635 B2 | 5/2007 | Brask et al. |
| 7,316,949 B2 | 1/2008 | Doczy et al. |
| 7,317,231 B2 | 1/2008 | Metz et al. |

(Continued)

OTHER PUBLICATIONS

Chi-Sheng Tseng et al., U.S. Appl. No. 13/278,186, filed on Oct. 21, 2012, pp. 1-33.

*Primary Examiner* — Michele Fan
(74) *Attorney, Agent, or Firm* — J.C. Patents (57) ABSTRACT

A manufacturing method for a semiconductor device having a metal gate is provided. First and second gate trenches are respectively formed in first and second semiconductor devices. A work-function metal layer is formed in the first and second gate trenches. A shielding layer is formed on the substrate. A first removing step is performed, so that the remaining shielding layer is at bottom of the second gate trench and fills up the first gate trench. A second removing step is performed, so that the remaining shielding layer is at bottom of the first gate trench to expose the work-function metal layer at sidewall of the first gate trench and in the second gate trench. The work-function metal layer not covered by the remaining shielding layer is removed, so that the remaining work-function metal layer is only at bottom of the first gate trench. The remaining shielding layer is removed.

18 Claims, 7 Drawing Sheets

(56) References Cited

U.S. PATENT DOCUMENTS

| | | |
|---|---|---|
| 7,326,610 B2 | 2/2008 | Amos et al. |
| 7,355,281 B2 | 4/2008 | Brask et al. |
| 7,390,709 B2 | 6/2008 | Doczy et al. |
| 7,795,097 B2 * | 9/2010 | Pas .................... 438/278 |
| 8,222,132 B2 * | 7/2012 | Lee et al. ............. 438/589 |
| 8,669,618 B2 | 3/2014 | Fu et al. |
| 2006/0051957 A1 * | 3/2006 | Brask et al. ........... 438/637 |
| 2007/0155114 A1 * | 7/2007 | Ban et al. ............. 438/396 |
| 2007/0262451 A1 | 11/2007 | Rachmady et al. |
| 2009/0039433 A1 | 2/2009 | Yang et al. |
| 2009/0057769 A1 | 3/2009 | Wei et al. |
| 2009/0186458 A1 | 7/2009 | Yu et al. |
| 2010/0052066 A1 | 3/2010 | Yu et al. |
| 2010/0065926 A1 | 3/2010 | Yeh et al. |
| 2010/0068877 A1 | 3/2010 | Yeh et al. |
| 2011/0104880 A1 * | 5/2011 | Heinrich et al. ......... 438/585 |
| 2012/0052641 A1 * | 3/2012 | Lee et al. ............. 438/270 |
| 2012/0129331 A1 * | 5/2012 | Choi et al. ............ 438/592 |
| 2012/0256276 A1 * | 10/2012 | Hwang et al. ........... 257/410 |
| 2012/0289040 A1 * | 11/2012 | Huang et al. ........... 438/591 |
| 2012/0319214 A1 * | 12/2012 | Ma et al. .............. 257/410 |
| 2013/0102145 A1 * | 4/2013 | Huang et al. ........... 438/595 |

* cited by examiner

MANUFACTURING METHOD FOR SEMICONDUCTOR DEVICE HAVING METAL GATE

BACKGROUND OF THE INVENTION

1. Field of Invention

The present invention relates to a manufacturing method for forming a semiconductor device having a metal gate.

2. Description of Related Art

MOS is a basic structure widely applied to various semiconductor devices, such as memory devices, image sensors and display devices. An electric device is required to be made lighter, thinner and smaller. As the CMOS is continuously minimized, a logic CMOS technology is developed towards a technology having a high dielectric constant (high-k) dielectric layer and a metal gate. In order to provide a correct and adequate work function value for the interface between the metal gate and the gate dielectric layer, different work function metal layers for NMOS and PMOS devices are provided between the corresponding metal gates and high-k gate dielectric layers.

However, the work function metal layers are easy to have overhang at the gate trench openings, so that the gate trench openings are reduced, and thus, the metal filling layer can not be filled in successfully, or a seam may occur in the metal filling layer in the gate trenches. Therefore, the reliability of the devices is affected.

SUMMARY OF THE INVENTION

The present invention provides a manufacturing method for forming a semiconductor device having a metal gate, in which different work function metal layers for NMOS and PMOS devices are provided between the corresponding metal gates and high-k gate dielectric layers, and the metal filling layer can fill in the gate trenches successfully.

The present invention provides a manufacturing method for a semiconductor device having a metal gate. A substrate having a first semiconductor device and a second semiconductor device formed thereon is provided. The first semiconductor device has a first gate trench therein and the second semiconductor device has a second gate trench therein. A first work function metal layer is formed in the first gate trench and the second gate trench. A first shielding layer is formed on the substrate. A first removing step is performed to remove a first portion of the first shielding layer, so that the remaining first shielding layer is located at a bottom of the second gate trench and fills up the first gate trench. A second removing step is performed to remove a second portion of the remaining first shielding layer, so that the remaining first shielding layer is located at a bottom of the first gate trench to expose the first work function metal layer at a sidewall of the first gate trench and in the second gate trench. A portion of the first work function metal layer not covered by the remaining first shielding layer is removed by using the remaining first shielding layer as a mask, so that the remaining first work function metal layer is only located at the bottom of the first gate trench. The remaining first shielding layer is removed.

According to an embodiment of the present invention, before removing the first portion of the first shielding layer, the manufacturing method further includes: forming a patterned mask layer on the first shielding layer to cover the first semiconductor device and expose the second semiconductor device; performing the first removing step to remove the first portion of the first shielding layer on the second semiconductor device by using the patterned mask layer as a mask; and removing the patterned mask layer.

According to an embodiment of the present invention, a method of performing the first removing step to remove the first portion of the first shielding layer includes an etching process.

According to an embodiment of the present invention, a method of performing the second removing step to remove the second portion of the first shielding layer includes an etching process.

According to an embodiment of the present invention, the first shielding layer includes a dielectric anti-reflection coating (DARC), a light absorbing oxide (DUO) layer, a bottom anti-reflective coating (BARC) or a sacrificial light absorbing material layer.

According to an embodiment of the present invention, the first work function metal layer includes titanium nitride (TiN), titanium carbide (TiC), tantalum nitride (TaN), tantalum carbide (TaC), tungsten carbide (WC) or aluminum titanium nitride (TiAlN).

According to an embodiment of the present invention, the manufacturing method further includes forming a second work function metal layer in the first gate trench and the second gate trench.

According to an embodiment of the present invention, the second work function metal layer includes titanium aluminide (TiAl), zirconium aluminide (ZrAl), tungsten aluminide (WAl), tantalum aluminide (TaAl) or hafnium aluminide (HfAl).

According to an embodiment of the present invention, the manufacturing method further includes forming a metal filling layer to fill up the first gate trench and the second gate trench.

According to an embodiment of the present invention, the metal filling layer includes Al, TiAl, or titanium aluminum oxide (TiAlO).

According to an embodiment of the present invention, the manufacturing method further includes forming an upper barrier layer in the first gate trench and the second gate trench to cover the first work function metal layer.

According to an embodiment of the present invention, the upper barrier layer includes titanium nitride.

According to an embodiment of the present invention, before forming the upper barrier layer, the manufacturing method further includes forming a second work function metal layer in the first gate trench and the second gate trench.

According to an embodiment of the present invention, the manufacturing method further includes forming a metal filling layer to fill up the first gate trench and the second gate trench.

According to an embodiment of the present invention, before forming the first work function metal layer, the manufacturing method further includes forming a lower barrier layer in the first gate trench and the second gate trench.

According to an embodiment of the present invention the lower barrier layer includes titanium nitride.

According to an embodiment of the present invention, before forming the first work function metal layer, the manufacturing method further includes forming an etch stop layer on the lower barrier layer.

According to an embodiment of the present invention the etch stop layer includes tantalum nitride.

According to an embodiment of the present invention, the manufacturing method further includes: forming an upper barrier layer and a second work function metal layer in the first gate trench and the second gate trench; and forming a metal filling layer on the second work function metal layer, so as to fill up the first gate trench and the second gate trench.

According to an embodiment of the present invention, before forming the first work function metal layer, the manufacturing method further includes: forming a lower barrier layer in the first gate trench and the second gate trench; and forming an etch stop layer on the lower barrier layer.

According to an embodiment of the present invention, before forming the upper barrier layer, the manufacturing method further includes: forming a second shielding layer on the substrate to cover the first semiconductor device and the second semiconductor device; removing a portion of the second shielding layer to expose the etch stop layer at the sidewalls of the first gate trench and the second gate trench; removing a portion of the exposed etch stop layer and a portion of the lower barrier layer by using the remaining second shielding layer as a mask; and removing the remaining second shielding layer.

According to an embodiment of the present invention, tops of the remaining etch stop layer and the remaining lower barrier layer are lower than tops of the first gate trench and the second gate trench after removing the portion of the exposed etch stop layer and the portion of the lower barrier layer by using the remaining second shielding layer as a mask.

According to an embodiment of the present invention, the second shielding layer includes a dielectric anti-reflection coating (DARC), a light absorbing oxide (DUO) layer, a bottom anti-reflective coating (BARC) or a sacrificial light absorbing material layer.

In the present invention, in the manufacturing method for forming a semiconductor device having a metal gate, different work function metal layers for NMOS and PMOS devices are provided between the corresponding metal gates and high-k gate dielectric layers, and the metal filling layer can fill in the gate trenches successfully.

In order to make the aforementioned and other objects, features and advantages of the present invention comprehensible, a present embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Reference will now be made in detail to the present embodiments of the invention, examples of which are illustrated in the accompanying drawings. Wherever possible, the same reference numbers are used in the drawings and the description to refer to the same or like parts.

FIGS. 1A-1K are schematic cross-sectional drawings illustrating a manufacturing method for a semiconductor device having a metal gate provided by a first embodiment of the present invention.

Figure 1A:
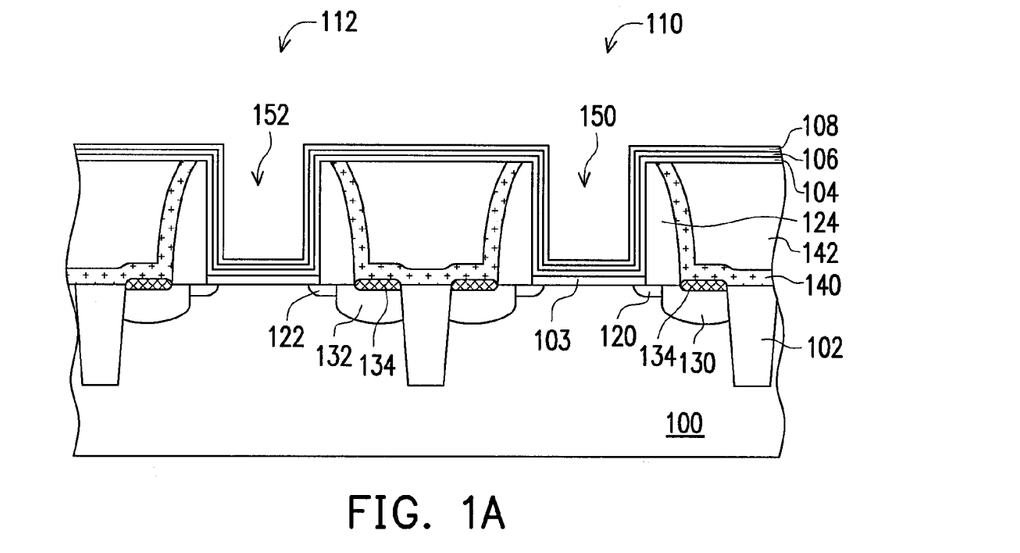
FIGS. 1A-1K are schematic cross-sectional drawings illustrating a manufacturing method for a semiconductor device having a metal gate provided by a first embodiment of the present invention.

Referring to FIG. 1A, the present embodiment first provides a substrate 100 such as silicon substrate, silicon-containing substrate, or silicon-on-insulator (SOI) substrate. The substrate 100 has a first semiconductor device 110 and a second semiconductor device 112 formed thereon. A shallow trench isolation (STI) structure 102 is formed in the substrate 100 between the first semiconductor device 110 and the second semiconductor device 112 for providing electrical isolation. The first semiconductor device 110 has a first conductivity type, the second semiconductor device 112 has a second conductivity type, and the first conductivity type and the second conductivity type are complementary. In the present embodiment, the first semiconductor device 110 is a P-type semiconductor device while the second semiconductor device 112 is an N-type semiconductor device.

Continue referring to FIG. 1A, a first gate trench 150 and a second gate trench 152 are respectively formed in the first semiconductor device 110 and the second semiconductor device 112. Each of the first semiconductor device 110 and the second semiconductor device 112 includes a gate dielectric layer 104, a lower barrier layer 106 and an etch stop layer 108. Furthermore, the first semiconductor device 110 includes a first lightly doped drain (LDD) 120, a first source/drain 130 and a spacer 124, and the second semiconductor device 112 includes a second LDD 122, a second source/drain 132 and a spacer 124. Additionally, an optional salicide layer 134 is formed on each of the first source/drain 130 and the second source/drain 132.

Before forming the first gate trench 150 and the second gate trench 152, a contact etch stop layer (CESL) 140 and an inter-layer dielectric (ILD) layer 142 are sequentially formed. Since the process steps and material choices for the above-mentioned elements are well-known to those skilled in the art, those details are omitted herein in the interest of brevity. Furthermore, selective strain scheme (SSS) can be used in the present embodiment. For example, a selective epitaxial growth (SEG) method can be used to form the first source/drain 130 and the second source/drain 132.

The gate dielectric layer 104 can be a conventional silicon oxide ($SiO_2$) layer, a high-dielectric-constant (high-k) gate dielectric layer with a dielectric constant greater than 4, or its combination. The high-k material with a dielectric constant greater than 4 can be metal oxide, such as rare earth metal oxide. The high-k material can be selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST), wherein x is between 0 and 1. Additionally, an interfacial layer 103 can be formed between the high-k gate dielectric layer 104 and the substrate 100. The interfacial layer 103 can include silicon oxide. The lower barrier layer 106 can include titanium nitride (TiN), and the forming method thereof includes forming an atomic layer deposition (ALD) process. The etch stop layer 108 can include tantalum nitride (TaN), and the forming method thereof includes performing an ALD process, but not limited to this.

The present embodiment can be integrated with the "high-k last" process. That is, the high-k gate dielectric layer is formed after the process steps of forming a dummy gate and removing the dummy gate. Specifically, the method includes forming an interfacial material layer on the substrate 100, and then forming a dummy gate layer. The dummy gate layer can include polysilicon, but not limited to this. Thereafter, the interfacial material layer and the dummy gate layer are patterned, so as to form a patterned interfacial material layer and a dummy gate. Afterwards, a CESL 140 and a ILD layer 142 are formed, and a planarization process is performed to remove a portion of the CESL 140 and a portion of the ILD layer 142 to expose the dummy gate of each of the first semiconductor device 110 and the second semiconductor device 112. Then, a suitable etching process is performed to remove the dummy gate of each of the first and second semiconductor devices 110 and 112, and thus a first gate trench 150 and a second gate trench 152 are simultaneously formed in the first semiconductor device 110 and the second semiconductor device 112, respectively. The interfacial material layer can be optionally removed and an interfacial layer 103 is then formed. A high-k gate dielectric layer 104 is thereafter formed on the substrate 100. A lower barrier layer 106 and/or an etch stop layer 108 are afterwards formed.

Figure 1B:
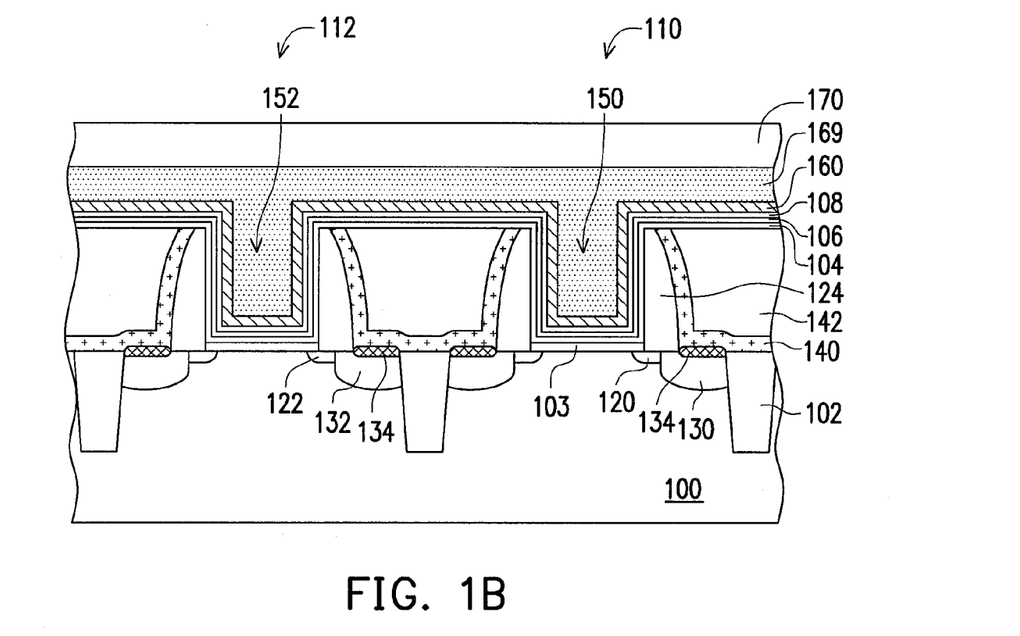

Referring to FIG. 1B, after forming the etch stop layer 108, a first work function metal layer 160 is formed on the substrate 100 filling in the first gate trench 150 and the second gate trench 152. The first work function metal layer 160 can be a p-type work function metal layer and exemplarily includes TiN, TaN, titanium carbide (TiC), tantalum carbide (TaC), tungsten carbide (WC), or aluminum titanium nitride (TiAlN), but not limited to this. In addition, the first work function metal layer 160 can be a single-layered structure or a multi-layered structure. The method of forming the first work function metal layer 160 includes performing a chemical vapor deposition (CVD) process, a physical vapor deposition (PVD) process or an ALD process.

Thereafter, a first shielding layer 169 and a mask layer 170 are formed on the substrate 100. The first shielding layer 169 can include a material having superior gap-filling ability and can be a dielectric anti-reflection coating (DARC), a light absorbing oxide (DUO) layer, a bottom anti-reflective coating (BARC) or a sacrificial light absorbing material (SLAM) layer, but not limited to this. The method of forming the first shielding layer 169 includes performing a spin coating process. The mask layer 170 can include a photoresist material.

Figure 1C:
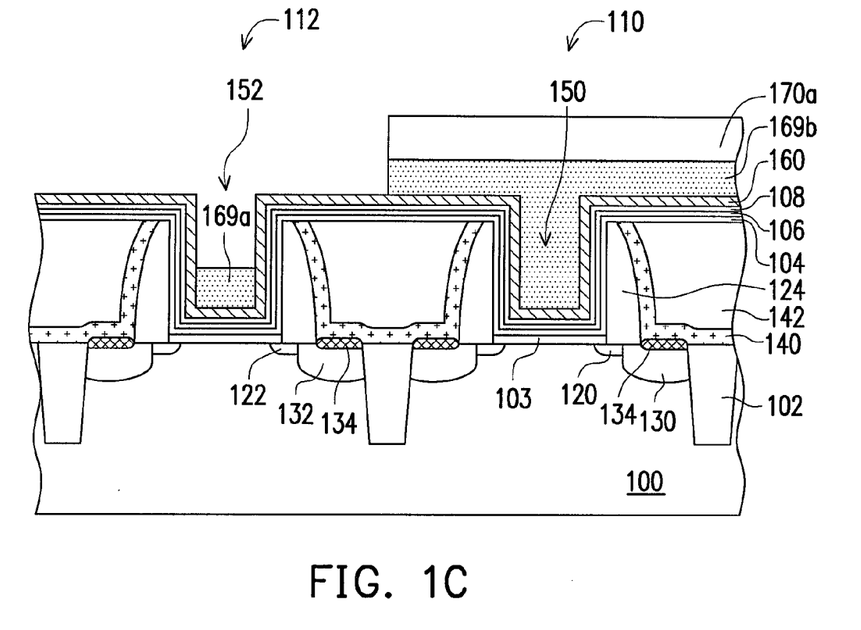

Referring to FIG. 1C, the mask layer 170 is patterned to form a patterned mask layer 170a. The patterned mask layer 170a covers the first shielding layer 169 on the first semiconductor device 110 but exposes the first shielding layer 169 on the second semiconductor device 112. Thereafter, a portion of the first shielding layer 169 not covered by the patterned mask layer 170a is removed by using the patterned mask layer 170a as a mask, so as to retain a first shielding layer 169a in the second gate trench 152 and a first shielding layer 169b on the first semiconductor device 110. The top surface of first shielding layer 169a in the second gate trench 152 is lower than the top of the second gate trench 152, and thus, a portion the first work function metal layer 160 is exposed. The method of removing the portion of the first shielding layer 169 not covered by the patterned mask layer 170a includes performing an etching back process with a suitable etchant.

Figure 1D:
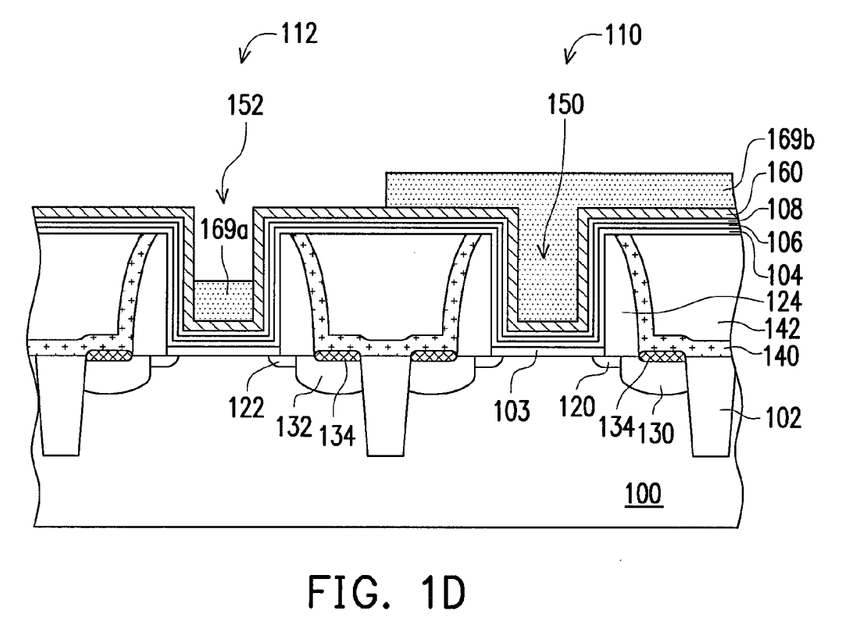

Referring to FIG. 1D, the patterned mask layer 170a is removed to expose the first shielding layer 169b on the first semiconductor device 110. The method of removing the patterned mask layer 170a includes performing a wet etching process, a dry etching process or both. The bottoms of the first gate trench 150 and the second gate trench 152 are respectively covered by the first shielding layer 169b and the first shielding layer 169a, so as to prevent plasma of the subsequent plasma etching process from passing through the first work function metal layer 160 to damage the etch stop layer 108, the lower barrier layer 106 and the high-k gate dielectric layer 104.

Figure 1E:
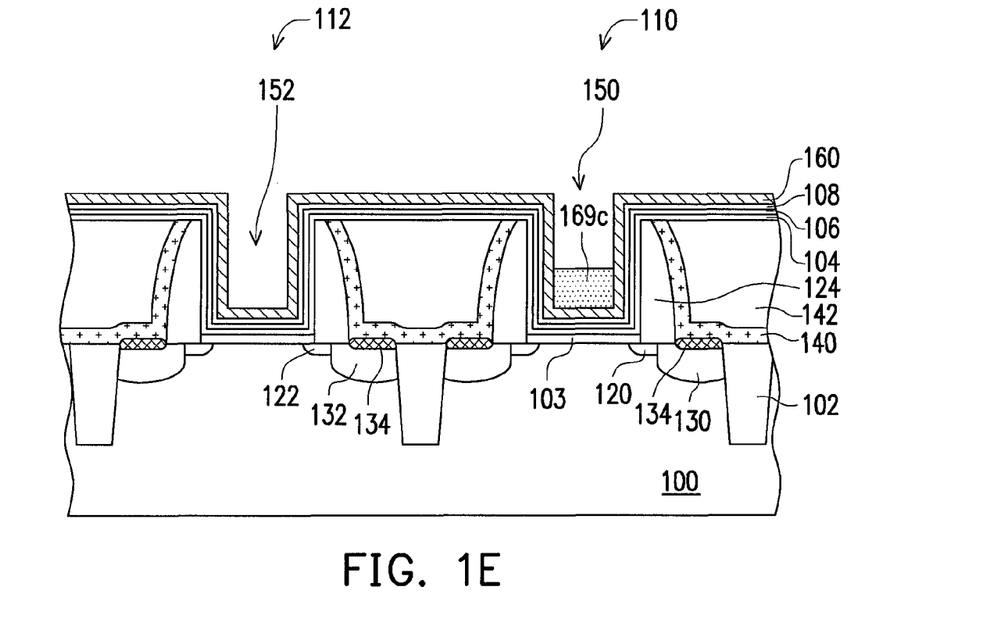

Referring to FIG. 1E, a portion of the first shielding layer 169b is removed to retain a first shielding layer 169c at the bottom of the first gate trench 150, and the first shielding layer 169a is completely removed. The top surface of the first shielding layer 169c is lower than the top of the first gate trench 150. Preferably, the first shielding layer 169c is as thin as possible; it can expose the first work function metal layer 160 at the sidewall of the first gate trench 150 as much as possible, as long as it can protect the first work function metal layer 160 at the bottom of the first gate trench 150 from being damaged by the following etching process. The method of removing the portion of the first shielding layer 169b includes performing an etching process, such as a dry etching process.

Figure 1F:
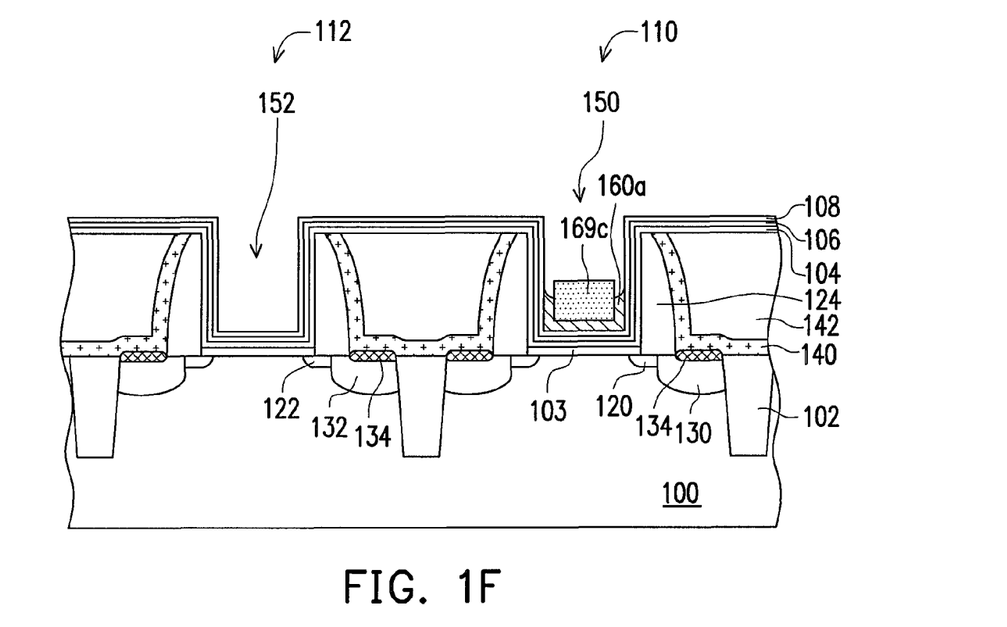

Referring to FIG. 1F, a suitable etchant is used to remove the first work function metal layer 160 not protected by the first shielding layer 169c by using the first shielding layer 169c as a mask. During the etching step, the first work function metal layer 160 at the sidewall of the first gate trench 150 is removed as much as possible, so as to retain a first work function metal layer 160a at the bottom of the first gate trench 150 and expose the etch stop layer 108 at the sidewall of the first gate trench 150. In FIG. 1F, the first work function metal layer 160a is U-shaped. In another embodiment, the etching time can be controlled, so that the first work function metal layer 160a only covers the bottom of the first gate trench 150 without covering the sidewall of the first gate trench 150.

Figure 1G:
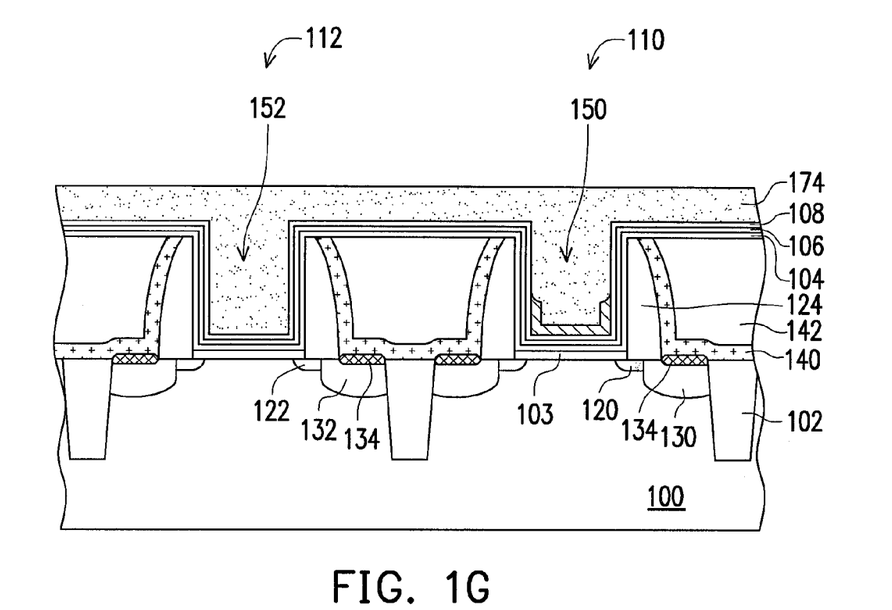

Referring to FIG. 1G, the first shielding layer 169c is removed to expose the surface of the first work function metal layer 160a. The method of removing the first shielding layer 169c includes performing an etching process, such as a dry etching process. Thereafter, a second shielding layer 174 is formed on the substrate 100. The second shielding layer 174 can include a material having superior gap-filling ability and can be a dielectric anti-reflection coating (DARC), a light absorbing oxide (DUO) layer, a bottom anti-reflective coating (BARC) or a sacrificial light absorbing material (SLAM) layer, but not limited to this. The method of forming the second shielding layer 174 includes performing a spin coating process.

Figure 1H:
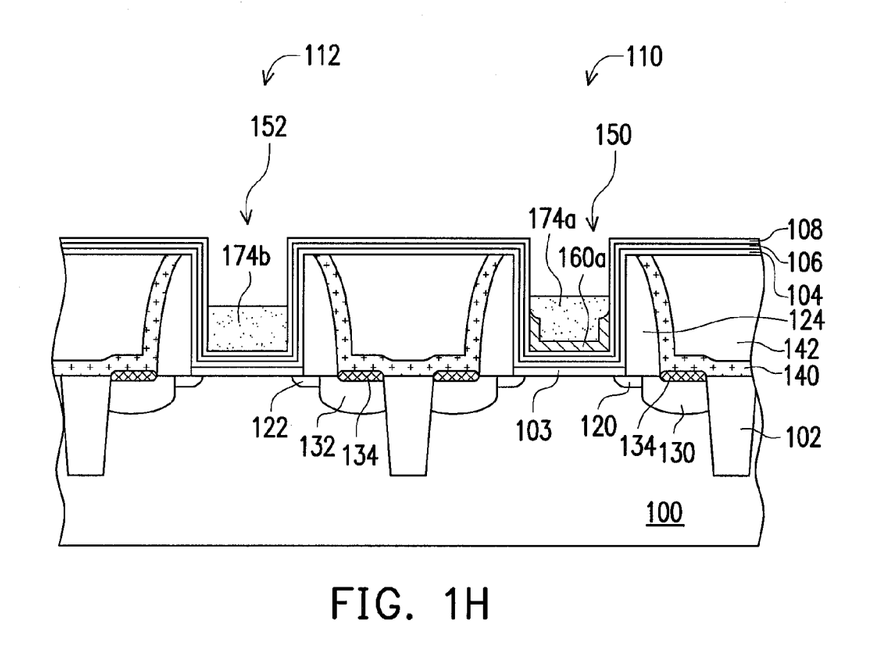

Referring to FIG. 1H, a portion of the second shielding layer 174 is removed, so as to retain a second shielding layer 174a in the first gate trench 150 and a second shielding layer 174b in the second gate trench 152 and expose the etch stop layer 108 at the sidewall of each of the first gate trench 150 and the second gate trench 152. The method of removing the portion of the second shielding layer 174 includes performing an etching back process with a suitable etchant. The second shielding layers 174a and 174b are as thin as possible, as long as it can protect the surface of the first work function metal layer 160a from being damaged by the following etching process.

Figure 1I:
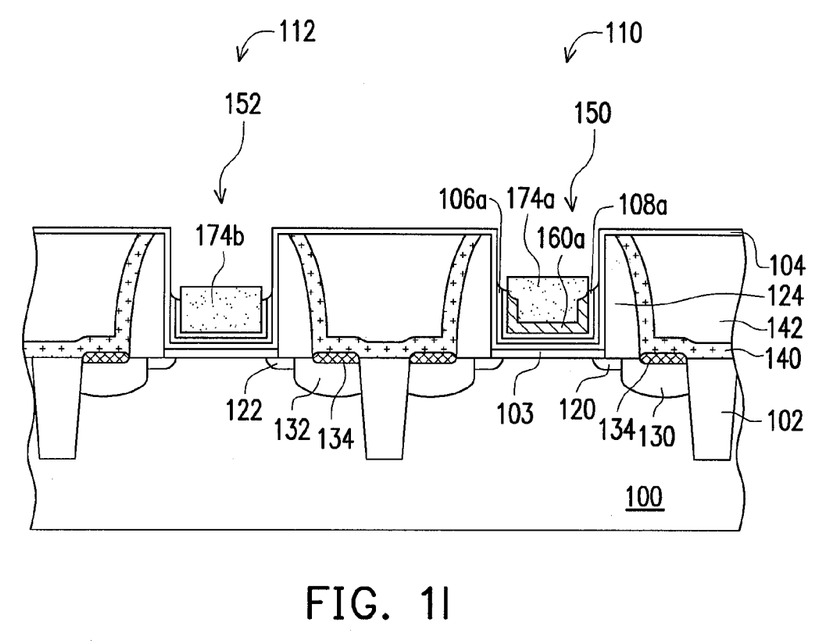

Referring to FIG. 1I, with the second shielding layers 174a and 174b as a mask, a suitable etchant is used to remove the etch stop layer 108 and the lower barrier layer 106 not protected by the second shielding layers 174a and 174b. During the etching step, a portion of the etch stop layer 108 and a portion of the lower barrier layer 106 at the sidewall of each of the first and second gate trenches 150 and 152 are removed, and thus, the high-k gate dielectric layer 104 at the sidewall of each of the first and second gate trenches 150 and 152 is exposed, and an U-shaped etch stop layer 108a and an U-shaped lower barrier layer 106a, both of which are of low height, in each of the first and second gate trenches 150 and 152 remain. The U-shaped etch stop layer 108a can be as referred to a first U-shaped metal layer, and the U-shaped lower barrier layer 106a can be as referred to a second U-shaped metal layer. The first U-shaped metal layer, the second U-shaped metal layer and the first work function metal layer 160a can have the same or different sidewall heights. Besides, those three layers are not necessary to have the heights as shown in FIG. 1I, and the height of each layer can be adjusted by the etching parameters as well as the heights of the first shielding layer 169c and the second shielding layers 174a and 174b.

Figure 1J:
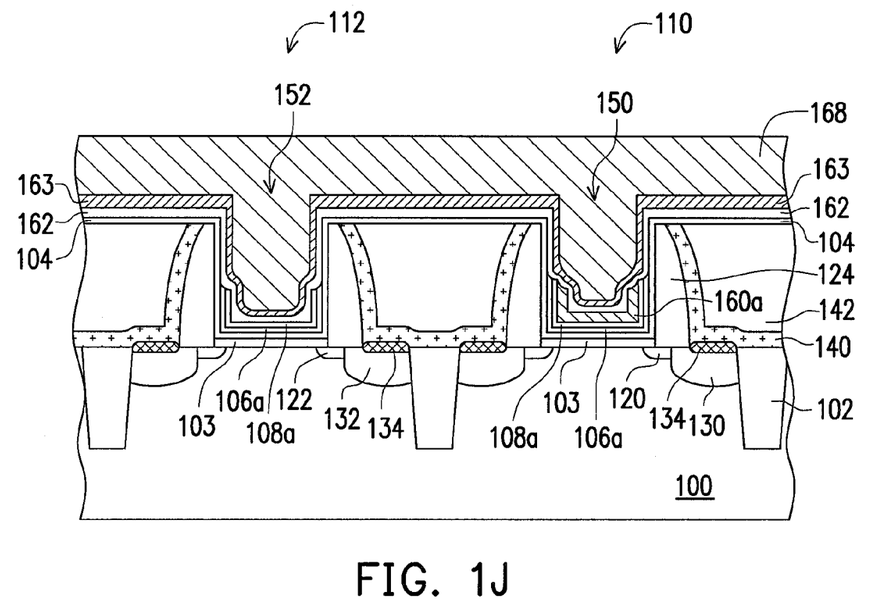

Referring to FIG. 1J, the second shielding layers 174a and 174b are removed to expose the first work function metal layer 160a in the first gate trench 150 and the U-shaped etch stop layer 108a in the second gate trench 152. Thereafter, a second work function metal layer 162 is formed on the substrate 100. The second work function metal layer 162 can be an N-type work function metal layer, such as a titanium aluminide (TiAl) layer, a zirconium aluminide (ZrAl) layer, a tungsten aluminide (WAl) layer, a tantalum aluminide (TaAl) layer, but not limited to this. In addition, the second work function metal layer 162 can be a single-layered structure or a multi-layered structure. The second work function metal layer 162 can be formed through a CVD process or a PVD process. Thereafter, a metal filling layer 168 is formed on the substrate 100. The metal filling layer 168 fills in both of the first gate trench 150 and the second gate trench 152. The metal filling layer 168 fills up the first gate trench 150 and the second gate trench 152. The metal filling layer 168 can include a material with low resistance and superior gap-filling characteristic, such as Al, TiAl, or titanium aluminum oxide (TiAlO), but not limited to this. Additionally, an upper barrier layer 163 is preferably formed between the second work function metal layer 162 and the metal filling layer 168. The upper barrier layer can include TiN, and the forming method thereof includes performing an ALD process, but not limited to this.

Figure 1K:
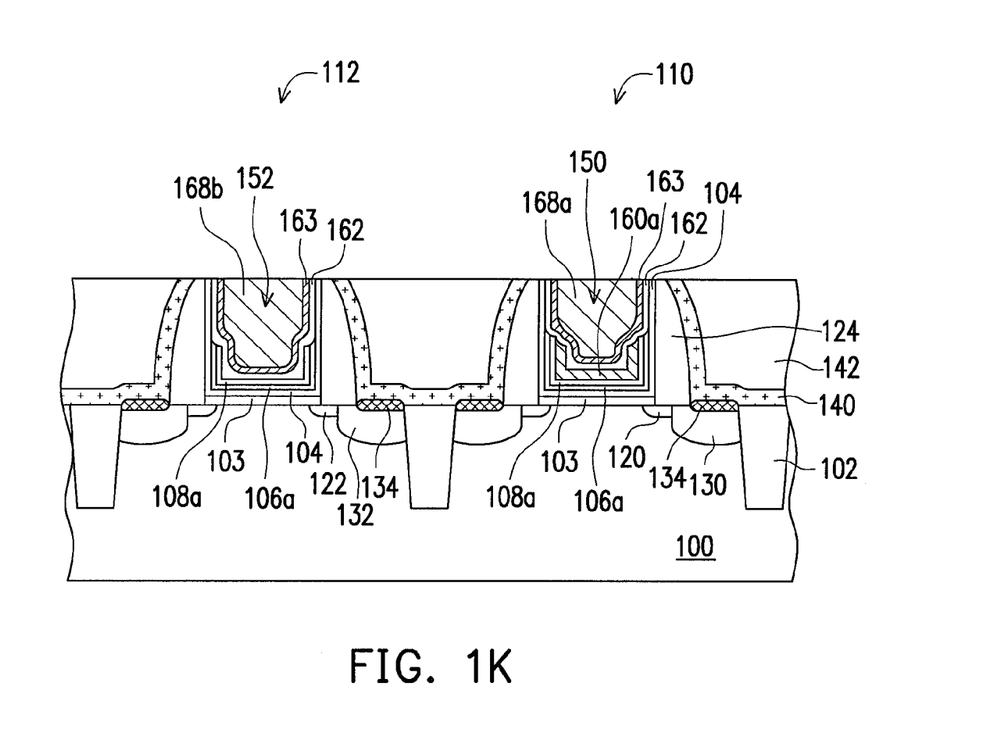

Referring to FIG. 1K, a planarization process such as a chemical mechanical polishing (CMP) process is performed to remove the unnecessary metal filling layer 168, the upper barrier layer 163 and the second work function metal layer 162 on the ILD layer 142. Consequently, a first metal gate 168a and a second metal gate 168b are obtained. In addition, the ILD layer 142 and the CESL 140 can be selectively removed and sequentially reformed on the substrate 100 for improving the electric performance of the semiconductor devices. Since the abovementioned CMP process is well-known to those skilled in the art, those details are omitted in the interest of brevity.

In the said embodiment, the step of FIG. 1I (i.e. the step of removing the etch stop layer 108 and the lower barrier layer 106 at sidewalls of the first and second gate trenches 150 and 152 by using the second shielding layers 174a and 174b as a mask) is performed in order to fill the second work function metal layer 162, the upper barrier layer 163 and the metal filling layer 168 successfully in the first and second gate trenches 150 and 152. However, when the upper portions of the first and second gate trenches 150 and 152 are great enough or the etch stop layer 108 and the lower barrier layer 106 are thick enough, the second work function metal layer 162, the upper barrier layer 163 and the metal filling layer 168 can fill successfully in the first and second gate trenches 150 and 152 without performing the step of FIG. 1I. Accordingly, the steps of FIGS. 1G to 1I (i.e. from the step of forming the second shielding layer 170 to the step of removing the etch stop layer 108 and the lower barrier layer 106 at sidewalls of the first and second gate trenches 150 and 152) are optional and can be adjusted according to the actual requirement.

The said embodiment of the "high-k last" process is provided for illustration purposes, and is not construed as limiting the present invention. Another embodiment can be integrated with the "high-k first" process.

Figure 2A:
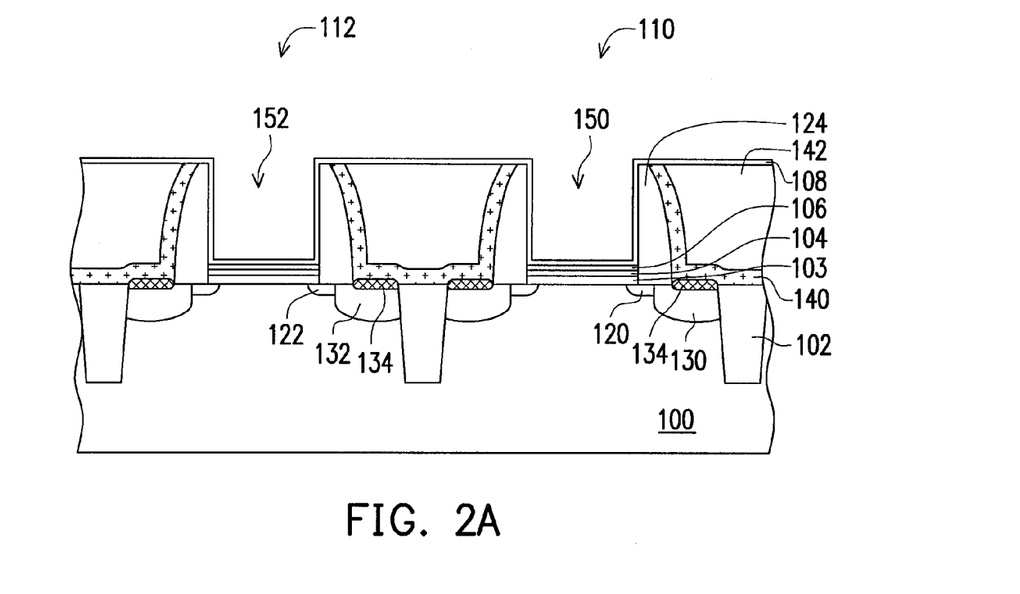
FIGS. 2A-2B are schematic cross-sectional drawings illustrating a manufacturing method for a semiconductor device having a metal gate provided by a second embodiment of the present invention.
Figure 2B:
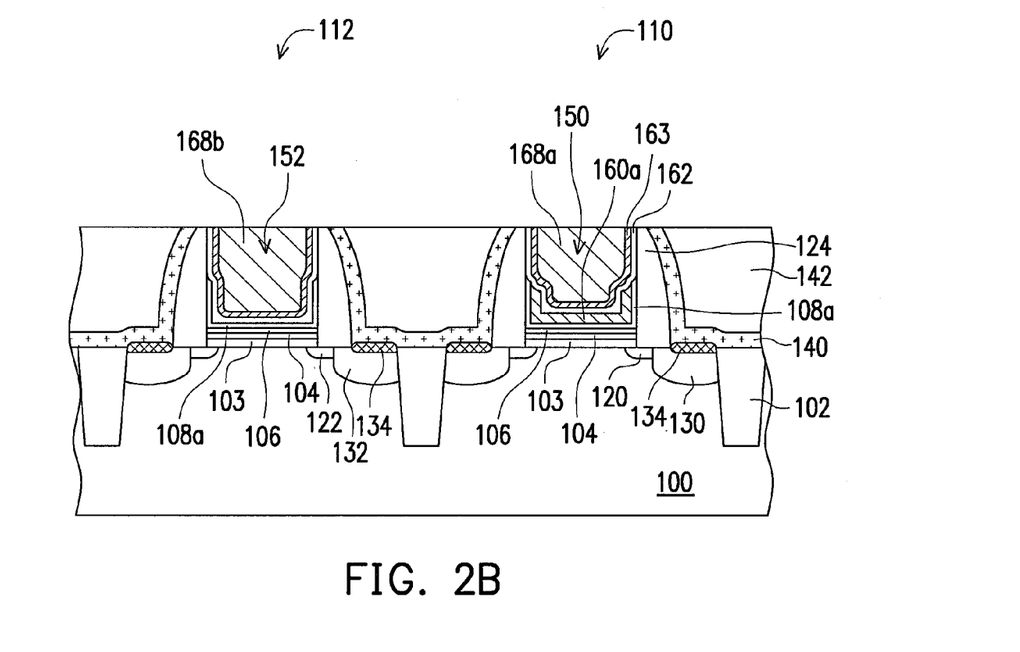

FIGS. 2A-2B are schematic cross-sectional drawings illustrating a manufacturing method for a semiconductor device having a metal gate provided by a second embodiment of the present invention.

Referring to FIG. 2A, this embodiment can be integrated with the "high-k first" process. The first and second semiconductor devices 110 and 112 respectively have the first and second gate trenches 150 and 152 therein. Each of the first and second semiconductor devices 110 and 112 includes a gate dielectric layer 104, a lower barrier layer 106 and an etch stop layer 108. It is noted that a high-k gate dielectric layer is formed prior to the formation of the dummy gate. Specifically, the method includes forming an interfacial layer 103, forming a high-k gate dielectric layer 104 and a lower barrier layer 106, and then forming a dummy gate. Thereafter, the interfacial layer 103, the high-k gate dielectric layer 104 and the lower barrier layer 106 are patterned to form the structure as shown in FIG. 1A. Afterwards, a CESL 140 and a ILD layer 142 are formed, and a planarization process is performed to remove a portion of the CESL 140 and a portion of the ILD layer 142 to expose the dummy gate of each of the first and second semiconductor devices 110 and 112. Then, a suitable etching process is performed to remove the dummy gate of each of the first and second semiconductor devices 110 and 112, and thus a first gate trench 150 and a second gate trench 152 are simultaneously formed in the first semiconductor device 110 and the second semiconductor device 112, respectively. An etch stop layer 108 is then formed.

Referring to FIG. 2B, a first metal gate 168a and a second metal gate 168b are obtained according to the steps described in FIGS. 1B to 1K.

In the said embodiments of the present invention, before the step of removing the first work function metal layer 160 in the second gate trench 152, the bottom of the second gate trench 152 is covered by the first shielding layer 169a and not exposed to the outside, so as to prevent plasma of the subsequent plasma etching process from passing through the first work function metal layer 160 to damage the etch stop layer 108, the lower barrier layer 106 and the high-k gate dielectric layer 104 below the first work function metal layer 160 (FIG. 1D).

Furthermore, in the said embodiment of the present invention, the first work function metal layer 160, the etch stop layer 108 and the lower barrier layer 106 at the top and the upper sidewall of the first gate trench 150 are removed through an etching process, so as to form the work function metal layer 160a with special profile, the U-shaped etch stop layer 108a and the U-shaped lower barrier layer 106a at the bottom and lower sidewall of the first gate trench 150. Meanwhile, the etch stop layer 108 and the lower barrier layer 106 at the top and the upper sidewall of the second gate trench 152 are removed through the same etching process, so as to form the U-shaped etch stop layer 108a and the U-shaped lower barrier layer 106a at the bottom and lower sidewall of the second gate trench 152. The topmost portions of the first work function metal layer 160a, the U-shaped etch stop layer 108a and the U-shaped lower barrier layer 106a are all lower than the top openings of the first gate trench 150 and the second gate trench 152; that is, the top openings of the first gate trench 150 and the second gate trench 152 are not covered by the first work function metal layer 160a, the U-shaped etch stop layer 108a and the U-shaped lower barrier layer 106a, and thus, the opening sizes (opening diameters) of the first gate trench 150 and the second gate trench 152 remain as original. Furthermore, the aspect ratios of the first gate trench 150 and the second gate trench 152 are reduced and thus the metal filling layer 168 can be successfully formed to fill up the first gate trench 150 and the second gate trench 152 without any seam. Therefore, the reliability of the first semiconductor device 110 and the second semiconductor device 112 is improved (FIG. 1J).

In summary, according to the manufacturing method for a semiconductor device having a metal gate, before the step of removing the first work function metal layer in the gate trenches, a portion of the shielding layer retains in the gate trench in which the first work function metal layer will be totally removed, so as to prevent the etch stop layer, the lower barrier layer and the high-k gate dielectric layer below the first work function metal layer from being damaged by plasma of the subsequent plasma etching process. Furthermore, in the manufacturing method for a semiconductor device having a metal gate, the first work function metal layer, the etch stop layer and the lower barrier layer only cover the bottoms and lower sidewalls of the gate trenches. Therefore, the opening sizes (opening diameters) of the gate trenches remain as original while the aspect ratios of the gate trenches are reduced, so that the subsequent metal filling layer can fills in the gate trenches successfully to improve the reliability of the semiconductor devices.

The present invention has been disclosed above in the present embodiments, but is not limited to those. It is known to persons skilled in the art that some modifications and innovations may be made without departing from the spirit and scope of the present invention. Therefore, the scope of the present invention should be defined by the following claims.

What is claimed is:

1. A manufacturing method for a semiconductor device having a metal gate, comprising:
   providing a substrate having a first semiconductor device and a second semiconductor device formed thereon, the first semiconductor device having a first gate trench therein and the second semiconductor device having a second gate trench therein;
   forming a lower barrier layer in the first gate trench and the second gate trench;
   forming an etch stop layer on the lower barrier layer;
   forming a first work function metal layer in the first gate trench and the second gate trench;
   forming a first shielding layer on the substrate;
   performing a first removing step to remove a first portion of the first shielding layer, so that the remaining first shielding layer is located at a bottom of the second gate trench and fills up the first gate trench;
   performing a second removing step to remove a second portion of the remaining first shielding layer, so that the remaining first shielding layer is located at a bottom of the first gate trench to expose the first work function metal layer at a sidewall of the first gate trench and in the second gate trench;
   removing a portion of the first work function metal layer not covered by the remaining first shielding layer by using the remaining first shielding layer as a mask, so that the remaining first work function metal layer is only located at the bottom of the first gate trench;
   removing the remaining first shielding layer;
   forming a second shielding layer on the substrate to cover the first semiconductor device and the second semiconductor device;
   removing a portion of the second shielding layer to expose the etch stop layer at the sidewalls of the first gate trench and the second gate trench;
   removing a portion of the exposed etch stop layer and a portion of the lower barrier layer by using the remaining second shielding layer as a mask; and
   removing the remaining second shielding layer.

2. The manufacturing method of claim 1, further comprising, before removing the first portion of the first shielding layer,
   forming a patterned mask layer on the first shielding layer to cover the first semiconductor device and expose the second semiconductor device;
   performing the first removing step to remove the first portion of the first shielding layer on the second semiconductor device by using the patterned mask layer as a mask; and
   removing the patterned mask layer.

3. The manufacturing method of claim 2, wherein a method of performing the first removing step to remove the first portion of the first shielding layer comprises an etching process.

4. The manufacturing method of claim 2, wherein a method of performing the second removing step to remove the second portion of the first shielding layer comprises an etching process.

5. The manufacturing method of claim 1, wherein the first shielding layer comprises a dielectric anti-reflection coating (DARC), a light absorbing oxide (DUO) layer, a bottom anti-reflective coating (BARC) or a sacrificial light absorbing material layer.

6. The manufacturing method of claim 1, wherein the first work function metal layer comprises titanium nitride (TiN), titanium carbide (TiC), tantalum nitride (TaN), tantalum carbide (TaC), tungsten carbide (WC) or aluminum titanium nitride (TiAlN).

7. The manufacturing method of claim 1, further comprising forming a second work function metal layer in the first gate trench and the second gate trench.

8. The manufacturing method of claim 7, wherein the second work function metal layer comprises titanium aluminide (TiAl), zirconium aluminide (ZrAl), tungsten aluminide (WAl), tantalum aluminide (TaAl) or hafnium aluminide (HfAl).

9. The manufacturing method of claim 1, further comprising forming a metal filling layer to fill up the first gate trench and the second gate trench.

10. The manufacturing method of claim 9, wherein the metal filling layer comprises Al, TiAl, or titanium aluminum oxide (TiAlO).

11. The manufacturing method of claim 1, further comprising forming an upper barrier layer in the first gate trench and the second gate trench to cover the first work function metal layer.

12. The manufacturing method of claim 11, wherein the upper barrier layer comprises titanium nitride.

13. The manufacturing method of claim 11, further comprising, before forming the upper barrier layer, forming a second work function metal layer in the first gate trench and the second gate trench.

14. The manufacturing method of claim 11, further comprising forming a metal filling layer to fill up the first gate trench and the second gate trench.

15. The manufacturing method of claim 1, wherein the lower barrier layer comprises titanium nitride.

16. The manufacturing method of claim 1, wherein the etch stop layer comprises tantalum nitride.

17. The manufacturing method of claim 1, wherein tops of the remaining etch stop layer and the remaining lower barrier layer are lower than tops of the first gate trench and the second gate trench after removing the portion of the exposed etch stop layer and the portion of the lower barrier layer by using the remaining second shielding layer as a mask.

18. The manufacturing method of claim 1, wherein the second shielding layer comprises a dielectric anti-reflection coating (DARC), a light absorbing oxide (DUO) layer, a bottom anti-reflective coating (BARC) or a sacrificial light absorbing material layer.

* * * * *